(12) United States Patent
Chidambarrao et al.

(10) Patent No.: US 7,659,581 B2
(45) Date of Patent: Feb. 9, 2010

(54) TRANSISTOR WITH DIELECTRIC STRESSOR ELEMENT FULLY UNDERLYING THE ACTIVE SEMICONDUCTOR REGION

(75) Inventors: Dureseti Chidambarrao, Weston, CT (US); Brian J. Greene, Yorktown Heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 11/164,632

(22) Filed: Nov. 30, 2005

(65) Prior Publication Data

US 2007/0122956 A1 May 31, 2007

(51) Int. Cl.
*H01L 31/036* (2006.01)
(52) U.S. Cl. .................. 257/347; 257/288; 257/348; 257/E29.242; 257/E27.111; 257/E27.112; 257/E21.32; 257/E21.4; 257/E21.545; 257/E21.561; 257/E21.564; 257/E21.565
(58) Field of Classification Search .................. 257/288, 257/E29.169, E29.242, E21.4, 347, 348, 257/350, 353, 354, E27.111, E27.112, E21.32, 257/E21.545, E21.561, E21.564, E21.565
See application file for complete search history.

(56) References Cited

U.S. PATENT DOCUMENTS

| | | | |
|---|---|---|---|
| 6,656,782 B2 * | 12/2003 | Skotnicki et al. | ............ 438/221 |
| 6,717,216 B1 | 4/2004 | Doris et al. | |
| 6,884,667 B1 | 4/2005 | Doris et al. | |
| 2004/0113174 A1 | 6/2004 | Chidambarrao et al. | |
| 2005/0067294 A1 | 3/2005 | Choe et al. | |

FOREIGN PATENT DOCUMENTS

| CN | 1507071 A | 6/2004 |
|---|---|---|
| CN | 1684243 A | 10/2005 |

OTHER PUBLICATIONS

Title: Optical Properties of Porous Silicon Author: W. Theiß I. Physikalisches Institut, Aachen University of Technology (RWTH)—D-52056 Aachen, Germany Surface Science Reports vol. 29 (1997) pp. 91-192.

* cited by examiner

*Primary Examiner*—Kenneth A Parker
*Assistant Examiner*—Jay C Kim
(74) *Attorney, Agent, or Firm*—Daryl K. Neff; H. Daniel Schnurmann

(57) ABSTRACT

A compressive stress is applied to a channel region of a PFET by structure including a discrete dielectric stressor element that fully underlies the bottom surface of an active semiconductor region in which the source, drain and channel region of the PFET is disposed. In particular, the dielectric stressor element includes a region of collapsed oxide which fully contacts the bottom surface of the active semiconductor region such that it has an area coextensive with an area of the bottom surface. Bird's beak oxide regions at edges of the dielectric stressor element apply an upward force at edges of the dielectric stressor element to impart a compressive stress to the channel region of the PFET.

2 Claims, 5 Drawing Sheets

_US 7,659,581 B2_

TRANSISTOR WITH DIELECTRIC STRESSOR ELEMENT FULLY UNDERLYING THE ACTIVE SEMICONDUCTOR REGION

BACKGROUND OF THE INVENTION

The present invention relates to semiconductor devices and processing. More particularly, the invention relates to semiconductor devices with dielectric stressor elements and methods of making the same.

A compressive stress or tensile stress can be applied to some types of transistors to increase their performance. In particular, the performance of a p-type field effect transistor ("PFET") improves when a longitudinal (in the direction of current flow) compressive stress is applied to the channel region. On the other hand, the performance of an n-type field effect transistor ("NFET") improves when a longitudinal tensile stress is applied to the channel region.

Various structures have been proposed for imparting a compressive stress or tensile stress to such transistors. In some cases, it has been proposed to provide one or more stressor elements in proximity with an NFET or PFET for applying a beneficial stress to the transistor. For example, commonly assigned U.S. Patent Publication No. 2004/0113174 describes a way of embedding dielectric stressor elements in isolation regions at exterior edges of an active semiconductor region which houses an NFET or a PFET. In such case, the dielectric stressor element and the isolation region are merged. While enabling efficiencies, these isolation-stressor elements require that a design point be reached in which potentially conflicting requirements for the stress-applying function, the isolation function and the processing needed to fabricate them are all simultaneously satisfied.

Thus, according to the known art, dielectric stressor elements used for applying stresses to an NFET or PFET are constrained to the locations at which isolation regions are placed. To overcome this constraint, it is clear that further improved structures and processing are awaited.

SUMMARY OF THE INVENTION

In accordance with an aspect of the invention, a compressive stress is applied to a channel region of a PFET by structure including a discrete dielectric stressor element that fully underlies the bottom surface of an active semiconductor region in which the source, drain and channel region of the PFET is disposed. In particular, the dielectric stressor element includes a region of collapsed oxide which fully contacts the bottom surface of the active semiconductor region such that it has an area coextensive with an area of the bottom surface. Bird's beak oxide regions at edges of the dielectric stressor element apply an upward force at edges of the dielectric stressor element to impart a compressive stress to the channel region of the PFET.

In accordance with a particular aspect of the invention, preferably the chip is provided in which an active semiconductor region has a top surface at a major surface of a semiconductor substrate and a bottom surface at a first depth below the major surface. A p-type field effect transistor ("PFET") is provided which includes a channel region, a source region and a drain region, all of which are disposed within the active semiconductor region. A compressive stress is applied to the channel region of the PFET by a discrete dielectric stressor element that fully underlies the bottom surface of the active semiconductor region. In particular, the dielectric stressor element includes a region of collapsed oxide which fully contacts the bottom surface of the active semiconductor region such that it has an area coextensive with an area of the bottom surface.

DETAILED DESCRIPTION

In accordance with the embodiments of the invention described herein, a chip, i.e., a semiconductor chip, is provided in which an active semiconductor region has a top surface at a major surface of a semiconductor substrate and a bottom surface at a first depth below the major surface. A p-type field effect transistor ("PFET") is provided which includes a channel region, a source region and a drain region, all of which are disposed within the active semiconductor region. A compressive stress is applied to the channel region of the PFET by a discrete dielectric stressor element that fully underlies the bottom surface of the active semiconductor region. In particular, the dielectric stressor element includes a region of collapsed oxide which fully contacts the bottom surface of the active semiconductor region such that it has an area coextensive with an area of the bottom surface.

Figure 1:
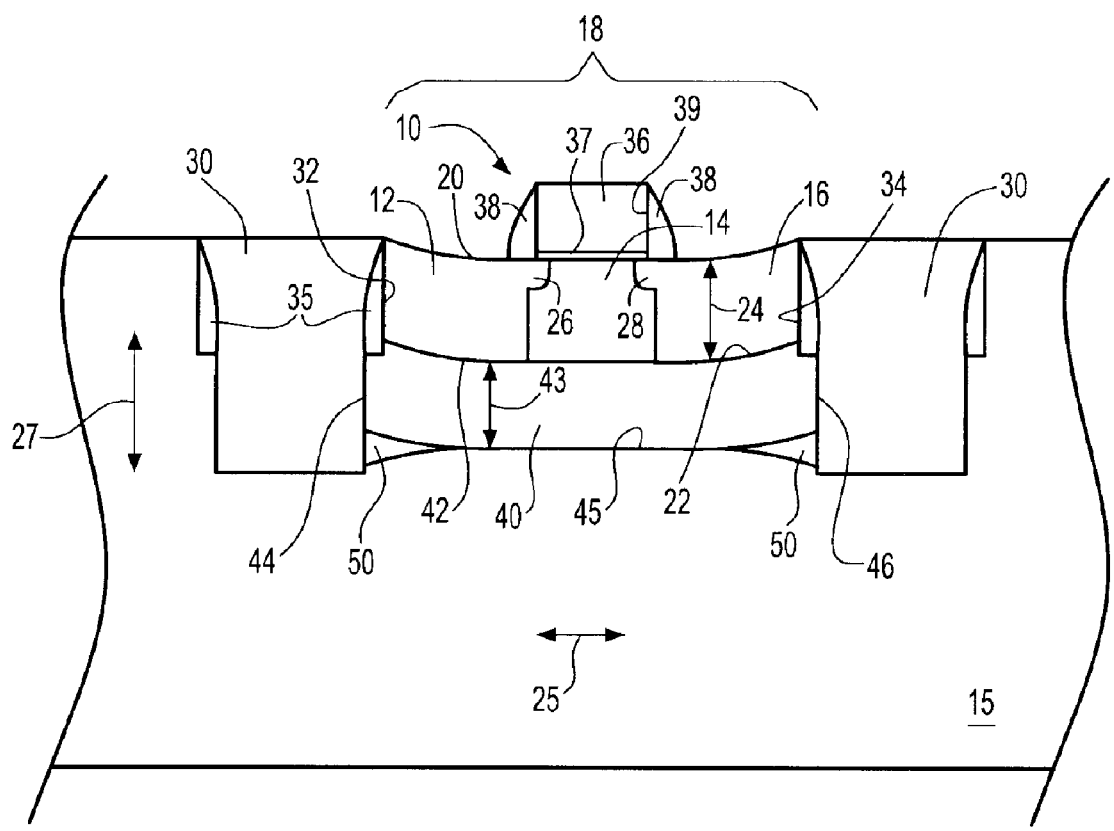
FIG. 1 is a sectional view, in a longitudinal direction, illustrating a PFET in accordance with an embodiment of the invention.
Figure 2:
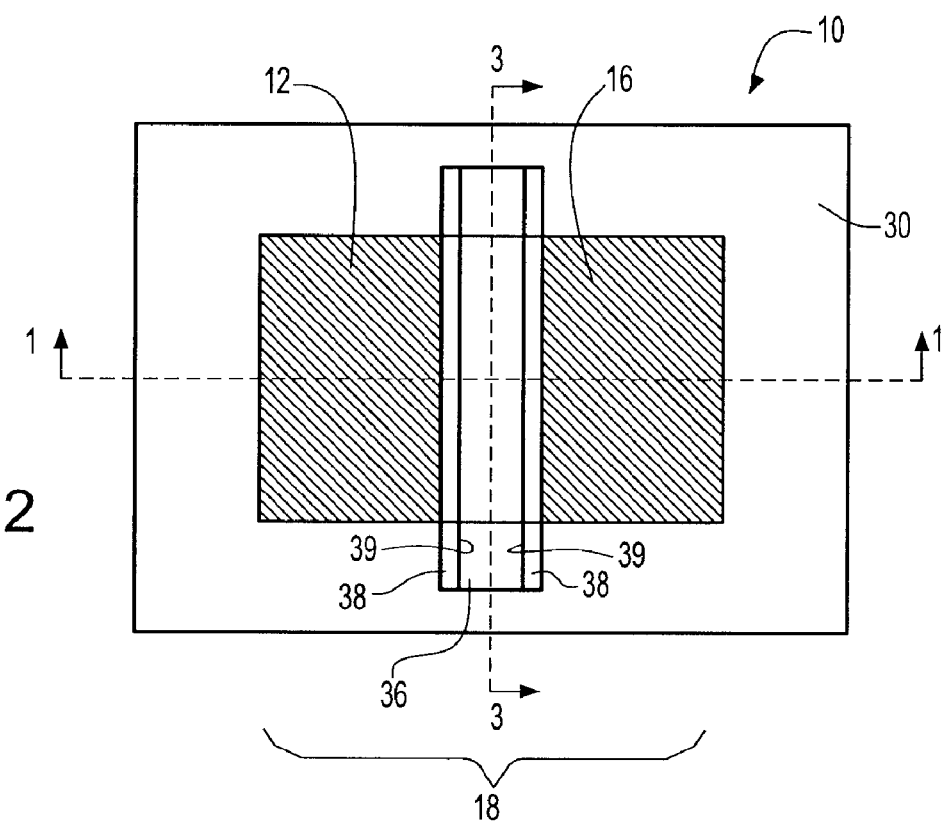
FIG. 2 is a corresponding top-down plan of the PFET illustrated in FIG. 1.
Figure 3:
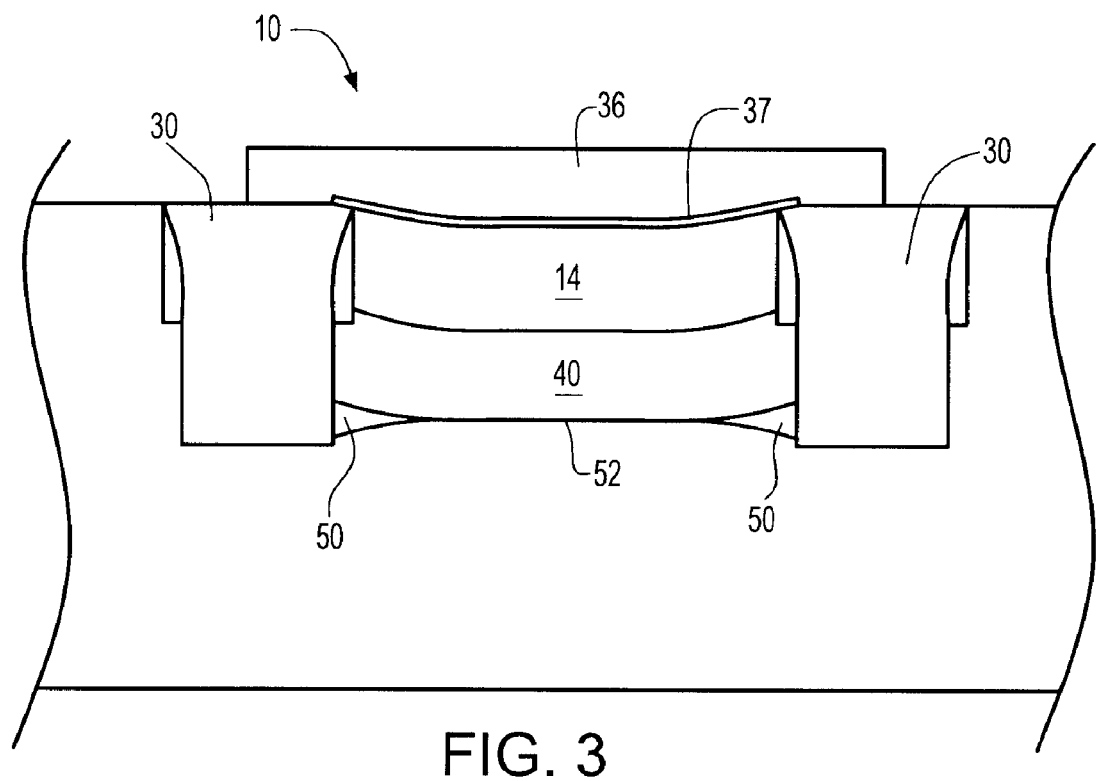
FIG. 3 is a corresponding sectional view in a transverse direction of the PFET illustrated in FIG. 1.

FIG. 1 is a sectional view illustrating a PFET 10 in accordance with an embodiment of the invention. FIG. 2 provides a corresponding plan view of the PFET 10, and the view of FIG. 1 is taken in a longitudinal direction along line 1-1 of FIG. 2. FIG. 3 provides another sectional view in a transverse direction of the PFET 10 through line 3-3 of FIG. 2. As shown in these figures, the PFET has a source region 12, a drain region 16 and a channel region 14 between the source and drain regions. Optional extension and/or halo regions 26, 28 may also be provided where the source region and the drain region meet the channel region, respectively. A gate conductor 36 overlies the channel region 14, as spaced therefrom by a gate dielectric 37. The gate conductor typically includes a doped semiconductor, a metal or a conductive compound of a metal. The gate dielectric preferably includes an oxide and/or a nitride or a combination of an oxide and a nitride. Preferably, when the semiconductor substrate consists essentially of silicon, the gate dielectric includes silicon dioxide. In a particular embodiment, the gate dielectric includes any one or several of a high dielectric constant material, of which ferroelectric dielectrics, perovskite materials, lead zirconium titanate and the like are examples. Preferably, dielectric spacers 38 are disposed in contact with walls 39 of the gate conductor 36, such spacers remaining from implantation processes used to define the locations of the source, drain and channel regions.

The source, drain and channel regions are disposed in an active semiconductor region 18 of the semiconductor substrate. With particular reference to FIG. 1, the active semiconductor region 18 has a top surface at a major surface 20 of a semiconductor substrate 15. A bottom surface 22 is disposed below the top surface at a depth defined by a thickness 24 of the active semiconductor region. As best seen in FIG. 2, the active semiconductor region 18 is bounded by a trench isolation region 30.

With further reference to FIG. 1, the trench isolation region 30 is preferably of the "shallow trench isolation" ("STI") type, such term usually used to refer to an isolation region provided by depositing a dielectric material into a trench formed prior such deposition, the trench typically having a depth from the major surface 20 of a semiconductor substrate of up to about 0.5 microns. Regardless of the depth, the term "shallow trench isolation" region can also refer to such dielectric structure which has a depth sufficient to isolate an active semiconductor region of the substrate from interaction with one or more other regions of the substrate disposed on a remote side of the STI.

The STI region 30 has walls which rise in a preferably at least substantially vertical direction 27 of the semiconductor substrate 15. However, optionally, the walls may rise at an angle to the vertical. Edges 32, 34 of the active semiconductor region, spaced apart in a longitudinal direction 25 of the PFET, are defined by the locations of the walls of the trench isolation region, the longitudinal direction being the direction of current flow between the source and drain regions of the transistor. As shown in FIG. 1, preferably, dielectric spacers 35 are provided inside the walls of the trench isolation region at the edges 32, 34 of the active semiconductor region. The spacers preferably include a dielectric material other than an oxide of silicon. More preferably, the spacers 35 consist essentially of silicon nitride when the trench isolation region 30 consists essentially of silicon dioxide.

As further shown in FIG. 1, a discrete dielectric stressor element 40 fully underlies and contacts the bottom surface 22 of the active semiconductor region 18. Stated another way, the entire bottom surface of the active semiconductor region is preferably in contact with the dielectric stressor element 40. As a result, a top surface 42 of the dielectric stressor element 40 has an area which is coextensive with an area of the bottom surface 22 of the active semiconductor region. The dielectric stressor element 40 includes a region of "collapsed oxide", such region preferably including an oxide of a semiconductor included in the active semiconductor region. The term "collapsed" is used because such region preferably occupies a somewhat smaller volume than the volume of semiconductor material from which it is initially formed. Like the active semiconductor region, the dielectric stressor element 40 is bounded by walls of the STI region 30, the walls defining edges 44, 46 of the dielectric stressor element which are spaced apart in the longitudinal direction 25 of the transistor. In addition, the dielectric stressor element 40 has a finite thickness 43 between a top surface 42 thereof and a bottom surface 45 in contact with a bulk semiconductor region 15 of the substrate.

Preferably, the spacers 35 extend from the major surface 20 of the semiconductor substrate only slightly below the top surface 42 of the dielectric stressor element. In a particular preferred example, the thickness 24 of the active semiconductor region from its bottom surface to the major surface preferably is between about 50 and 200 nanometers (nm), the thickness 43 of the dielectric stressor element 40 preferably is between about 50 and 500 nanometers (nm), and more preferably between about 50 and 200 nm.

As further shown in the sectional view along the longitudinal direction (FIG. 1) and in the sectional view along the transverse direction (FIG. 3), bird's beak oxide regions 50 extend from the walls of STI region 30 laterally inward under the collapsed oxide stressor element 40 towards the central portion of the stressor element 40 which underlies the channel region 14 of the PFET). The bird's beak oxide regions extend inwardly from the edges of the dielectric stressor element 40, becoming thinner the farther they extend from the edges 44, 46, typically until they end at locations underlying the dielectric stressor element. Preferably, the tip of the bird's beak oxide region extending from one edge 44 of the dielectric stressor element does not touch the tip of the bird's beak oxide region extending from the opposite edge 46. In such manner, the bird's beak oxide regions have a finite thickness at the edges 44, 46 and are not present under the active semiconductor region beyond the tips. However, it is not a specific requirement that the tips do not touch.

One effect produced by the bird's beak oxide regions 50 is that the bottom surface of the collapsed oxide stressor element 40 tends to be higher at its edges 44, 46 in relation to the STI region and the bottom surface tends to sag lower at points farther away from the edges 44, 46. Specifically, the bottom surface at edges 44, 46 of the stressor element 40 meets the STI region at higher points along the wall of the STI region than the bottom surface would in areas where the bottom surface 45 directly contacts the bulk region 15 of the semiconductor substrate. Thus, the effect of the bird's beak oxide 50 is to support the bottom surface 45 of the collapsed oxide region 40 only at edges 44, 46 thereof. In turn, a top surface 42 of the collapsed oxide region is indirectly supported by the bird's beak region, imparting an upward force upon the active semiconductor region 18 at edges 32, 34.

The upward force applied by the bird's beak oxide regions is present at the edges 32, 34 of the active semiconductor region. However, such force is not present at the center of the active semiconductor region or other locations well away from the edges. As a result, the net effect of the upwardly directed force at the edges 32, 34 is to "bend" or warp the top surface of the active semiconductor region upward at the edges 32, 34. This differential upward bending applies a compressive stress to the channel region 14 of the PFET.

Referring now to FIG. 4 through FIG. 7, a method of manufacturing the PFET 10 (FIGS. 1-3) will now be described. Such method utilizes a process similar to that described in commonly assigned U.S. Patent Publication No. 2005/0067294 to Choe et al. In Choe et al., a region of a silicon substrate is implanted and treated to form a buried oxide layer of a silicon-on-insulator ("SOI") substrate. A porous silicon region is formed by ion implantation of a p-type dopant (for example, Ga, Al, B and $BF_2$) and subsequent anodization. The porous silicon region is then oxidized to form the buried oxide layer.

In the present method, a process similar to that of Choe et al. is used, but not to form a buried oxide layer of an SOI substrate. Rather, by the present method, a discrete buried dielectric stressor element 40 (FIG. 1) is formed which extends between walls of a trench isolation region 30, and in which the above-described bird's beak oxide regions 50 cause a compressive stress to be applied to the channel region of the transistor.

Figure 4:
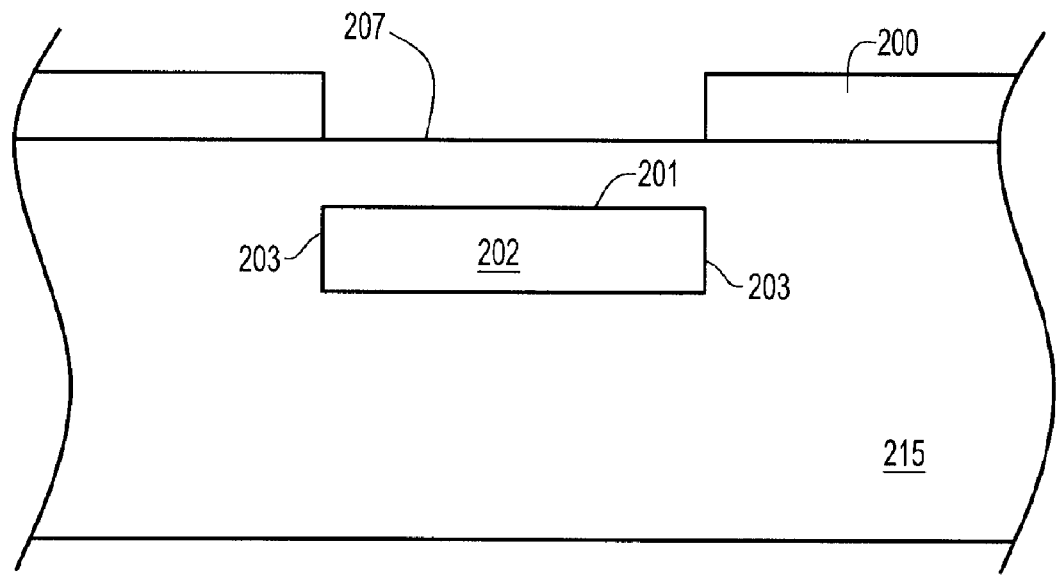
FIG. 4 is a sectional view illustrating a stage in a method of fabricating the PFET illustrated in FIGS. 1-3.

In such method, as shown in FIG. 4, a masking layer 200, e.g., a photoresist is patterned, and buried region 202 underlying a major surface 207 of the substrate 15 is implanted with a p-type dopant to form a pocket p-doped region. The dopant concentration can range from about $1 \times 10^{19}$ $cm^{-3}$ to about $5 \times 10^{20}$ $cm^{-3}$ or higher. However, in any case, the achieved boron concentration must be significantly higher, i.e., one or more orders of magnitude higher than a normal (p-) p-type dopant concentration in the single-crystal silicon. Preferably, the dopant consists essentially of boron (B) or boron fluoride (BF$_2$), but gallium (Ga) and aluminum (Al) can be used instead. The depth to which ions are implanted into the semiconductor substrate determines the thickness of the dielectric stressor element and its depth below the major surface 207. The depth of the implant, in turn, is selected in accordance with the energy at which the implant is conducted. As this implant is performed through a photolithographically patterned masking layer, the photolithographic process defines the locations of the edges 203 of the implanted region. These edges 203 extend in a direction away from a horizontally oriented upper surface 201 of the implanted region.

Thereafter, the masking layer 200 is stripped and the semiconductor substrate undergoes an anodization process to convert the pocket p-doped region into a buried porous semiconductor region. The pocket region becomes a porous semiconductor region as a result of the anodization process.

The anodization process is as follows. The semiconductor substrate 215, which preferably consists essentially of silicon and which has buried p-type implanted pocket regions is placed or preferably submerged in a bath containing a solution of hydrogen fluoride (HF), as well as a platinum electrode. The semiconductor substrate 215 is connected to a positive terminal of a current source, and the platinum electrode is connected to the negative terminal of that current source is connected in conductive communication with the current source that is connected to the positive terminal. The current source supplies an anodization current to the semiconductor substrate and the HF solution which controls the anodization process. In the presence of the anodization current, the HF solution readily diffuses through the single crystal semiconductor (silicon) to the higher p-type dopant concentration pocket region.

Figure 5:
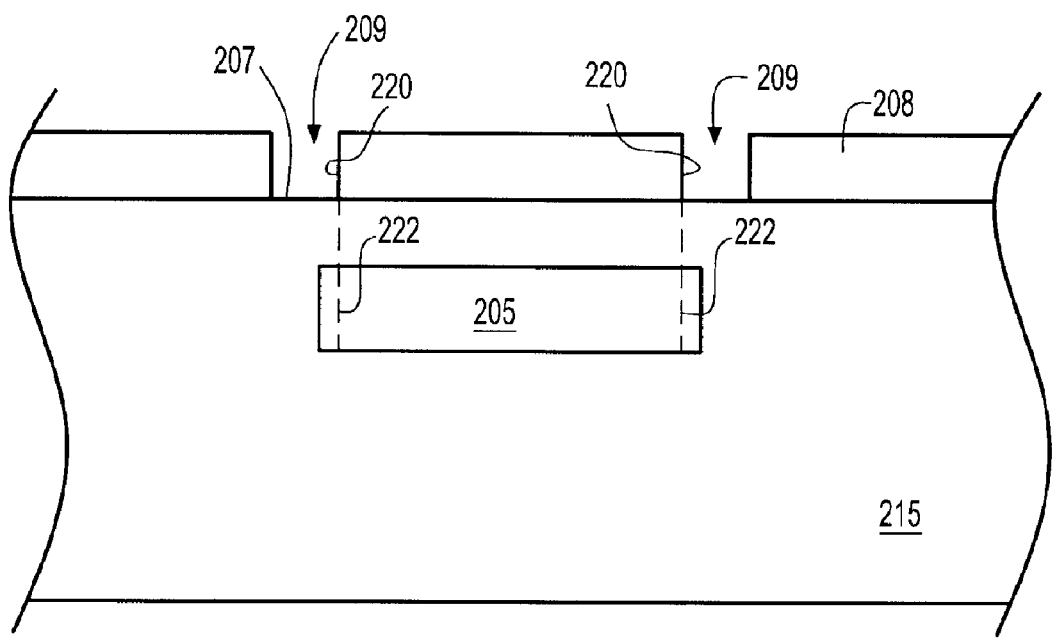
FIG. 5 is a sectional view illustrating a subsequent stage in a method of fabricating the PFET illustrated in FIGS. 1-3.

In the higher dopant concentration pocket region, the HF solution reacts with the highly doped p-type silicon to form a porous silicon pocket region 205 as shown in FIG. 5. This step is performed prior to forming an additional masking layer 208 as will be described below. The anodization current is in the range of 1 mA/cm$^2$ to 100 mA/cm$^2$, depending on the degree of porosity or density of the porous silicon region 205 which are to result from this process. Both the concentration of boron or other p-type dopant in the silicon and the magnitude of the anodization current can be used to control the degree of porosity. That is, these parameters control the density of the buried pocket region as measured by the mass of silicon the remains within each buried pocket region divided by its volume. For example, a low porosity region, that is, a region having a relatively high density, is one which has a density of greater than about 44% of the density of the original silicon substrate. On the other hand, a high porosity region, that is, a region having a relatively low density, is one which has a density of less than about 44% of the density of the original silicon substrate. In this case, the buried porous silicon region 205 needs to have high porosity such that upon subsequent oxidation, its volume will shrink and it will become a collapsed oxide stressor element 40 as described above (FIG. 1).

After anodization, the substrate is then subjected to a hydrogen bake, which removes most of the implanted boron remaining in the silicon. It is necessary to eliminate high concentrations of boron from the silicon substrate at this stage in order to avoid such high concentrations from interfering with processes used to subsequently define the differently doped regions of a transistor, i.e., the channel region, the source and drain regions, halo and/or extension regions. The hydrogen bake is conducted at temperatures ranging from about 800 degrees centigrade ("C") to 1,000 degrees C., for periods ranging from about 30 seconds to 30 minutes.

After the anodization and post-bake processes, a region of porous silicon remains in locations which are at least generally coextensive with the former pocket region. The porous silicon region is a region which contains a multiplicity of voids. As viewed with an electron microscope, the porous silicon region has an appearance similar to a sponge or foam material, having large numbers of voids which are supported together by connecting structure of the remaining silicon material.

Next, as illustrated in FIG. 5, another masking layer 208, e.g., a patterned hard mask material such as a pad silicon nitride is deposited and patterned over the major surface 207 of the substrate to form openings 209. The process of patterning the mask is performed such that the areas of the semiconductor substrate 215 that are exposed through the openings overlap with the buried porous semiconductor region 205. Stated another way, the edges 220 of the hard mask layer 208, extended downward into the substrate 215, overlap with the buried porous semiconductor region 205, as shown at locations 222. Overlapping these edges is important to guaranteeing that the buried porous semiconductor region becomes oxidized in subsequent processing.

Figure 6:
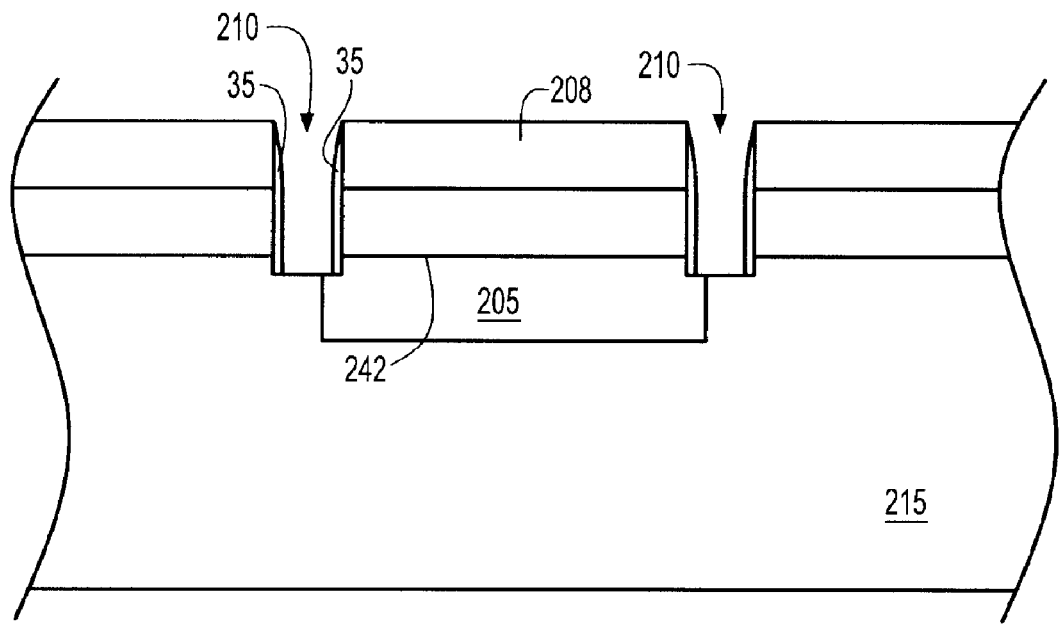
FIGS. 6 and 7 are sectional views illustrating still later stages in a method of fabricating the PFET illustrated in FIGS. 1-3.

As shown in FIG. 6, the substrate 215 is then patterned, preferably by an anisotropic vertical etch process such as a reaction ion etch ("RIE"), using this masking layer 208. Such etch process results in formation of perimetral trenches 210 extending downward into the substrate. This etch process is interrupted when the trenches 210 reach a depth just somewhat below the top surface 242 of the buried porous semiconductor region 205. Thereafter, dielectric spacers 35 are formed which extend along the vertical walls of the trenches 210, these spacers including a material such as silicon nitride or other nitride which can be preferentially etched in relation to silicon dioxide (or other oxide), and vice versa.

Then, once the dielectric spacers 35 are in place, the vertical etch process is continued until the bottoms 255 of the trenches 210 reach a depth below the bottom surface 245 of the buried porous semiconductor region 205. The exposed porous silicon region 205 is then subjected to an oxidation process. The oxidation process preferably is such as generally referred to as a "thermal" or "local" oxidation in which a source of oxygen which may be in molecular form, atomic form, or even in form of a compound such as water vapor is supplied to the exposed semiconductor material within the trenches. This condition is maintained in a chamber at elevated temperature until a desired amount of oxidation has taken place. Oxidation proceeds in laterally inward directions 248, 249 from edges 244, 246 of the buried porous semiconductor region 205. The result of the oxidation process is to form the buried dielectric stressor element 40 (FIG. 1 and 3). In addition, the bird's beak oxide regions 50 are formed during this oxidation process at the intersections between the bottom surface 245 and the edges 244, 246 of the buried porous semiconductor regions. During such oxidation process, the previously formed dielectric spacers 35 prevent the sidewalls 32, 34 of the active semiconductor region 18 from being oxidized.

Referring to FIG. 1 again, thereafter, the trenches 210 are filled with a dielectric material such as an oxide of silicon (e.g., silicon dioxide) to form the STI region 30. The dielectric fill is deposited via a high density plasma ("HDP") technique and/or other chemical vapor deposition ("CVD") technique including low pressure CVD ("LPCVD"), plasma enhanced CVD ("PECVD"), etc., which may involve deposition form a tetraethylorthosilicate ("TEOS") precursor, for example.

Thereafter, the gate conductor 36, dielectric spacers 38, and source and drain regions 12, 16, including optional extension regions and/or halo regions 26, 28 are formed by processes known to those skilled in the art to complete the PFET 10 (FIGS. 1 through 3).

Figure 8:
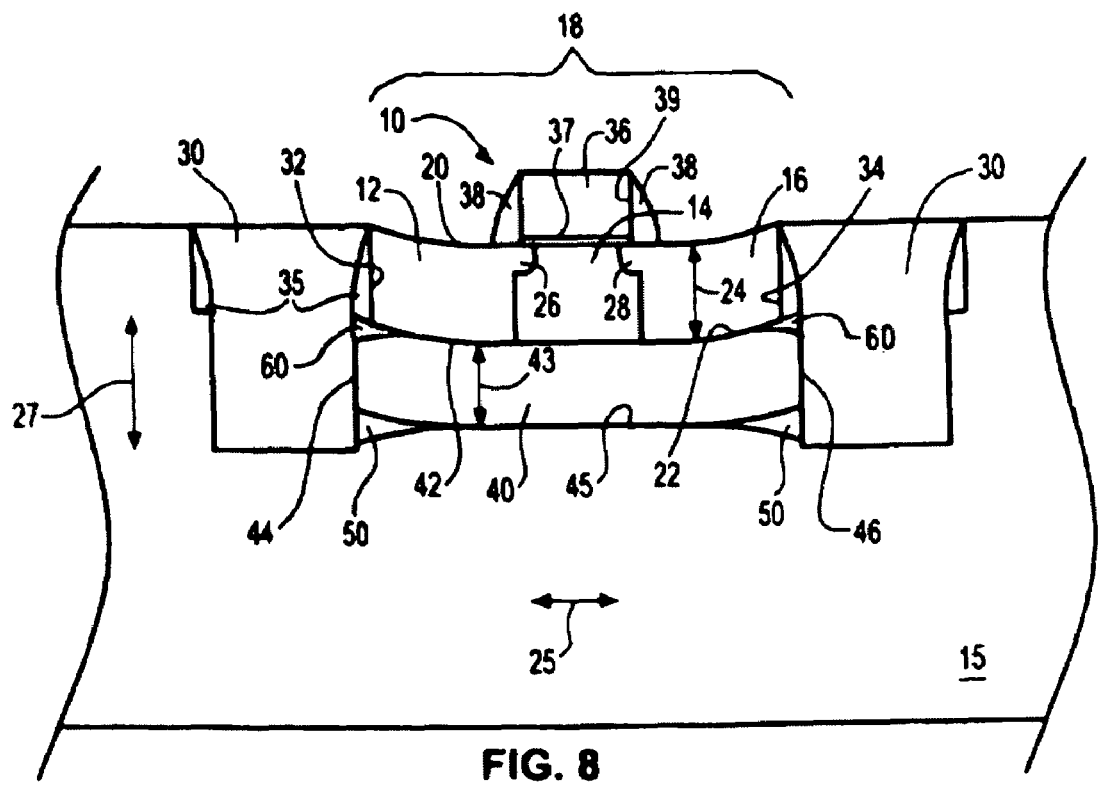
Figure 9:
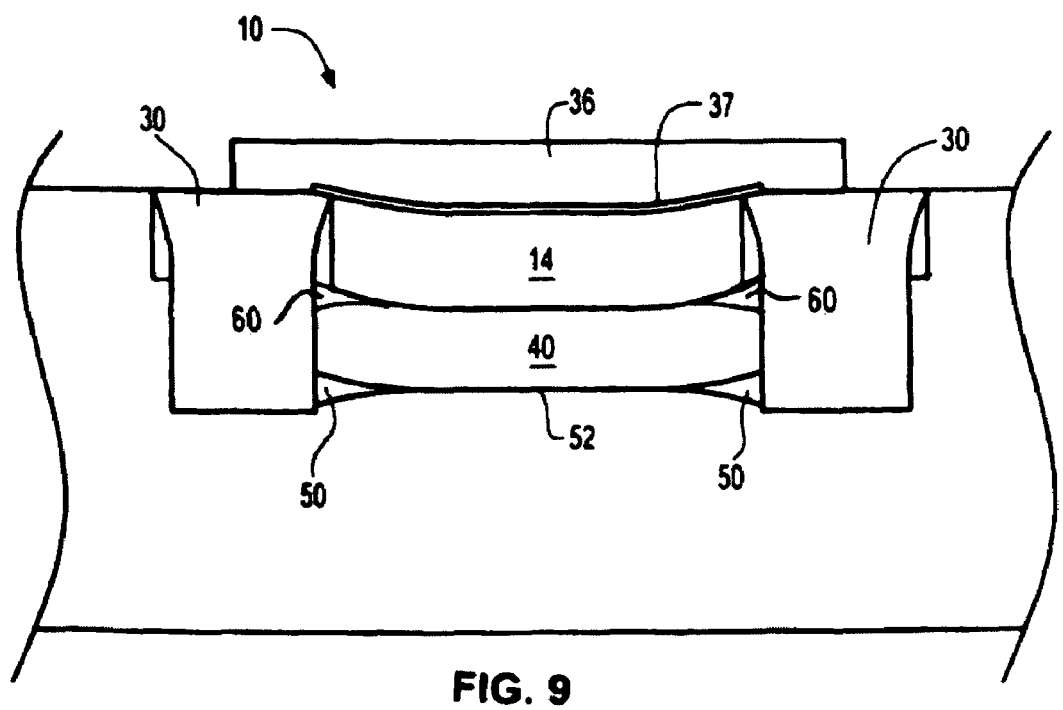

In a variation of the above-described embodiment, the bird's beak oxide regions 50 are not the only such bird's beak oxide regions that the structure includes. Referring to FIGS. 8 and 9, in such variation, upper bird's beak oxide regions 60 similar to the regions 50 illustrated therein are disposed between the top surface 42 of the dielectric stressor element and the bottom surface 22 of the active semiconductor region 18. These second (upper) bird's beak oxide regions 60 cooperate together with the first bird's beak oxide regions 50 in applying an upwardly directed force to the active semiconductor region at the edges of the active semiconductor region.

The second bird's beak oxide regions 60 have a shape and extent similar to the first bird's beak oxide regions 50. Like the first bird's beak oxide regions 50, the second bird's beak oxide regions 60 extend inwardly from the edges of the dielectric stressor element 40, becoming thinner the farther they extend from the edges 44, 46, typically until they end at locations underlying the active semiconductor region. Preferably, the tip of the bird's beak oxide region 60 extending from one edge 44 of the dielectric stressor element does not touch the tip of the bird's beak oxide region 60 extending from the opposite edge 46. In such manner, the bird's beak oxide regions 60 have a finite thickness at the edges 44, 46 and are not present under the active semiconductor region beyond the tips. However, it is not a specific requirement that the tips do not touch.

To manufacture the PFET having both the first and second bird's beak oxide regions, the processes described above are varied in the following ways. Referring to FIG. 6, when the trenches 210 are etched, the etching process is stopped when the trenches reach a depth which is just above the top surface 242 of the buried porous silicon region 205. Spacers are then formed on the inner sidewalls of the trenches. In this case, unlike the embodiment described above, these spacers do not cover the intersections between the edges 244, 246 (FIG. 7) and the top surface 242 of the buried porous silicon region. However, the spacers do cover edges of the active semiconductor region at locations closer to the top surface of the active semiconductor region.

Figure 7:
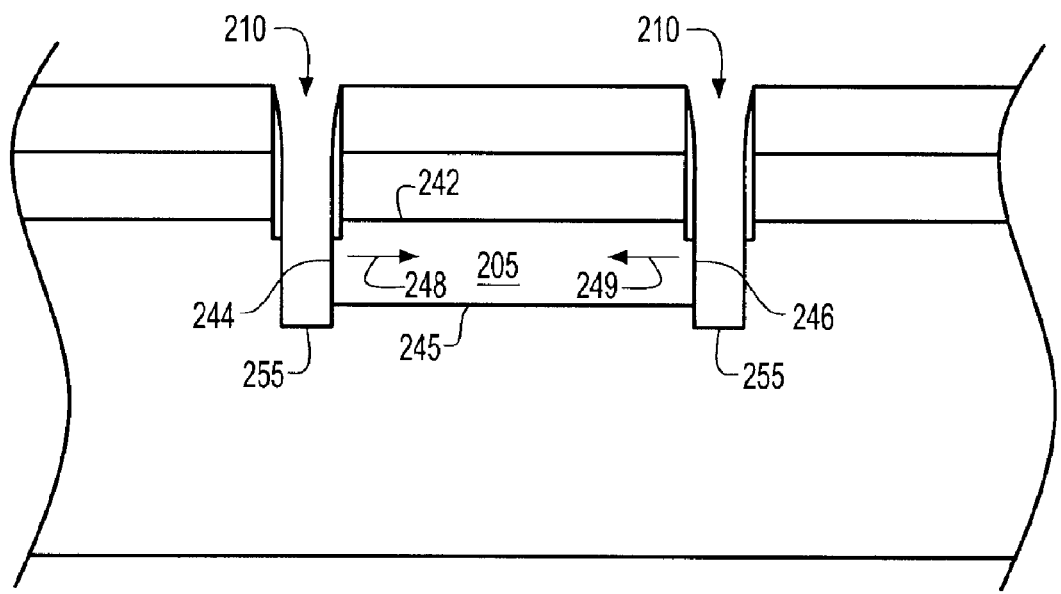

Thereafter, with the spacers in place along sidewalls of the trenches, vertically directed etching is performed using a process such as RIE until the trenches reach their final depth, i.e., preferably below the bottom surface 245 of the buried porous silicon region (FIG. 7). When the oxidation is performed, both the lower bird's beak oxide regions 50 are formed, as well as the upper bird's beak oxide regions 60 described here. As before, above the locations of the upper bird's beak oxide regions 60, the spacers protect the active semiconductor region at edges 32, 34 (FIG. 1) from being oxidized during the oxidation step.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip, comprising:
    a first semiconductor region;
    an active semiconductor region overlying the first semiconductor region, said active semiconductor region having a top surface, a bottom surface and edges extending between the top and bottom surfaces;
    a p-type field effect transistor ("PFET") having a channel region, a source region and a drain region all disposed within said active semiconductor region, and
    a dielectric stressor element disposed between the bottom surface of the active semiconductor region and the first semiconductor region, the dielectric stressor element including a buried oxide region separating an entirety of the active semiconductor region from the first semiconductor region;
    a trench isolation region having walls, wherein the buried oxide region and said edges of said active semiconductor region contact the walls of the trench isolation region; and
    bird's beak oxide regions disposed between the first semiconductor region and a bottom surface of the buried oxide region, the bird's beak oxide regions formed by local oxidation of semiconductor material and extending laterally inward from the walls of the trench isolation region below the buried oxide region, such that the bird's beak oxide regions become thinner the farther the bird's beak oxide regions extend from the walls of the trench isolation region until the bird's beak oxide regions end in tips underlying the buried oxide region, the bird's beak oxide regions causing the top surface of the active semiconductor region to bend upwardly at said edges and apply a compressive stress to said channel region of said PFET,
    wherein said bird's beak oxide regions are first bird's beak oxide regions, said chip further comprising second bird's beak oxide regions disposed between a top surface of the buried oxide region and the bottom surface of the active semiconductor region, the second bird's beak oxide regions formed by local oxidation of semiconductor material and extending laterally inward from the walls of the trench isolation region above the buried oxide region, such that the second bird's beak oxide regions become thinner the farther the second bird's beak oxide regions extend from the walls of the trench isolation region until the second bird's beak oxide regions end in tips overlying the buried oxide region.

2. The chip as claimed in claim 1, wherein said first and second bird's beak oxide regions apply an upwardly directed force to said active semiconductor region at said edges of said active semiconductor region.

* * * * *